United States Patent
Chen et al.

(10) Patent No.: US 9,964,832 B2
(45) Date of Patent: May 8, 2018

(54) DISTRIBUTED MACH-ZEHNDER MODULATOR (MZM) DRIVER DELAY COMPENSATION

(71) Applicant: Futurewei Technologies, Inc., Plano, TX (US)

(72) Inventors: Morgan Chen, San Jose, CA (US); Yifan Gu, Santa Clara, CA (US); Hungyi Lee, Cupertino, CA (US); Liang Gu, San Jose, CA (US); Yen Dang, San Jose, CA (US); Gong Lei, Sunnyvale, CA (US); Yuming Cao, Pleasanton, CA (US); Xiao Shen, San Bruno, CA (US); Yu Sheng Bai, Los Altos Hills, CA (US)

(73) Assignee: Futurewei Technologies, Inc., Plano, TX (US)

( * ) Notice: Subject to any disclaimer, the term of this patent is extended or adjusted under 35 U.S.C. 154(b) by 0 days. days.

(21) Appl. No.: 14/723,839

(22) Filed: May 28, 2015

(65) Prior Publication Data
US 2016/0352325 A1    Dec. 1, 2016

(51) Int. Cl.
*H03K 3/00*    (2006.01)
*G02F 1/225*    (2006.01)
*G02F 1/21*    (2006.01)

(52) U.S. Cl.
CPC ...... *G02F 1/2255* (2013.01); *G02F 2001/212* (2013.01)

(58) Field of Classification Search
CPC .................. H03K 5/133; H03K 5/134; H03K 2005/00058; H03K 19/013; H03K 17/284;
(Continued)

(56) References Cited

U.S. PATENT DOCUMENTS 5,151,622 A * 9/1992 Thrower ........ H03K 19/018521
                                                 326/71
5,757,718 A    5/1998 Suzuki
(Continued)

FOREIGN PATENT DOCUMENTS

CN    101562440 A    10/2009

OTHER PUBLICATIONS

Foreign Communication From a Counterpart Application, PCT Application No. PCT/CN2016/081150, International Search Report dated Aug. 12, 2016, 7 pages.
(Continued)

*Primary Examiner* — Patrick Chen
(74) *Attorney, Agent, or Firm* — Conley Rose, P.C.

(57) ABSTRACT

An electronic driver circuit for use with a modulator such as a segmented Mach-Zehnder Modulator (MZM) is provided. The electronic driver circuit includes a first delay buffer implemented as a first complementary metal-oxide-semiconductor (CMOS) inverter and a second delay buffer implemented as a second CMOS inverter. The second CMOS inverter follows the first CMOS inverter and has a second gate width smaller than a first gate width of the first CMOS inverter. The first CMOS inverter is configured to produce a first delayed electrical signal from a received electrical signal and the second CMOS inverter is configured to produce a second delayed electrical signal from the first delayed electrical signal produced by the first CMOS inverter.

19 Claims, 8 Drawing Sheets

(58) Field of Classification Search
CPC .. H03K 17/302; H03K 17/305; G02F 1/2255; G02F 1/2257; G02F 2001/212
USPC ........................................................ 327/108
See application file for complete search history.

(56) References Cited

U.S. PATENT DOCUMENTS

| | | | |
|---|---|---|---|
| 6,281,725 B1 * | 8/2001 | Hanzawa | H03K 5/135 |
| | | | 327/152 |
| 7,450,787 B2 | 11/2008 | Kucharski et al. | |
| 7,515,775 B1 | 4/2009 | Kucharski et al. | |
| 7,830,193 B2 | 11/2010 | Lin | |
| 2002/0191707 A1 | 12/2002 | Lee | |
| 2003/0076136 A1 * | 4/2003 | McCorkle | H03K 5/05 |
| | | | 327/112 |

OTHER PUBLICATIONS

Foreign Communication From a Counterpart Application, PCT Application No. PCT/CN2016/081150, Written Opinion dated Aug. 12, 2016, 4 pages.

* cited by examiner

PMOS

Fig. 4

NMOS

| Pre-Sim Condition | Min (ps) | Max (ps) | Variation (ps) |
|---|---|---|---|
| Increasingly sized delay buffers | 4.2 | 6.95 | 2.75 |
| Equally-sized delay buffers | 3.38 | 5.68 | 2.3 |
| Decreasingly sized delay buffers | 2.34 | 3.72 | 1.38 |

| Post-Sim Condition | Min (ps) | Max (ps) | Mean (ps) | Variation (ps) | Variation (%) |
|---|---|---|---|---|---|
| Equally-sized delay buffers | 8.372 | 12.91 | 10.641 | 4.54 | 42.67% |
| Decreasingly sized delay buffers | 6.7 | 9.8 | 8.25 | 3.1 | 37.58% |

DISTRIBUTED MACH-ZEHNDER MODULATOR (MZM) DRIVER DELAY COMPENSATION

CROSS-REFERENCE TO RELATED APPLICATIONS

Not applicable.

STATEMENT REGARDING FEDERALLY SPONSORED RESEARCH OR DEVELOPMENT

Not applicable.

REFERENCE TO A MICROFICHE APPENDIX

Not applicable.

BACKGROUND

A Mach-Zehnder Modulator (MZM) splits a received optical input (e.g., optical signal) into portions. One portion is provided to a first arm (e.g., waveguide) while the other portion is provided to a second arm. Phase change is applied to the optical signal portion propagating through one or both arms such that when the optical signal portions are later recombined, either constructive or destructive interference occurs. The phase change applied to the optical signal portions is a function of an electrical input voltage provided by an electronic driver circuit coupled to the MZM.

A segmented MZM contains multiple electrical inputs applied along one or both of the arms. Each electrical input is supplied with an electrical input voltage by the electronic driver circuit. A major challenge in designing a segmented MZM is ensuring that electrical signals received from the electronic driver circuit and optical signals propagating through the arms are aligned given that their respective velocities are different. This is readily apparent when comparing the optical index of a silicon waveguide, which is 4, to the electrical index of a silicon dioxide interlayer dielectric, which is 2. Because the electrical signal is faster than the optical signal, a common approach is to insert additional delay into the electronic driver circuit.

One known method to introduce delay into the electronic driver circuit is to use transmission lines. Transmission lines offer very accurate delay with precise delay control, but they have a number of drawbacks. For example, transmission lines require controlled impedance design and are prone to cross-talk. In addition, the routing of transmission lines requires complicated meandering. As a result, transmission line patterns are large, which may directly translate into higher cost. Further, transmission lines need higher power amplifiers, typically implementing analog-based topologies, to drive and receive.

In addition, buffer stages are usually implemented to drive large capacitive loads, and hence they normally have gate widths that increase in size with each additional stage. However, implementing delay buffer stages with increasingly fanned-out widths results in large delays on the order of 20 picoseconds (ps) and correspondingly poor precision on the order of 10 ps over process/voltage/temperature (PVT) corners. For silicon photonic applications, the amount of delay desired falls into an awkward region of being too small to achieve using normal active delay techniques and too large to achieve passively without considering transmission line effects. Therefore, a major problem is how to achieve an active delay that is much smaller than is normally available.

SUMMARY

In one embodiment, the disclosure includes an electronic driver circuit for a modulator including a first delay buffer implemented as a first complementary metal-oxide-semiconductor (CMOS) inverter having a first gate width, wherein the first CMOS inverter is configured to produce a first delayed electrical signal from a received electrical signal, and a second delay buffer following the first delay buffer, wherein the second delay buffer is implemented as a second CMOS inverter having a second gate width smaller than the first gate width of the first CMOS inverter, and wherein the second CMOS inverter is configured to produce a second delayed electrical signal from the first delayed electrical signal produced by the first CMOS inverter.

In another embodiment, the disclosure includes an electronic driver circuit for a modulator including a first delay stage including a first active delay element having a first gate width, wherein the first active delay element introduces a first active delay to a received electrical signal to produce a first delayed signal, and a second delay stage operably coupled to the first delay stage, wherein the second delay stage includes a first passive delay element and a second active delay element, wherein the second active delay element has a second gate width smaller than the first gate width of the first active delay element, and wherein the first passive delay element introduces a first passive delay and the second active delay element introduces a second active delay to the first delayed signal to produce a second delayed signal.

In yet another embodiment, the disclosure includes a method driving a modulator including generating, at first delay stage, a first delayed electrical signal from a received electrical signal using a first CMOS inverter having a first gate width, outputting the first delayed electrical signal to a first output buffer and a second delay stage, generating, at the second delay stage, a second delayed electrical signal from the first delayed electrical signal using a passive delay element and a second CMOS inverter, the second CMOS inverter having a second gate width smaller than the first gate width of the first CMOS inverter, and outputting the second delayed electrical signal to a second output buffer.

These and other features will be more clearly understood from the following detailed description taken in conjunction with the accompanying drawings and claims.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

DETAILED DESCRIPTION

It should be understood at the outset that although an illustrative implementation of one or more embodiments are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents.

Disclosed herein is an electronic driver circuit configured to drive a segmented MZM. As will be more fully explained below, the electronic driver circuit generates delays using decreasingly sized delay buffer stages. Specifically, accurate and precise delay is accomplished by implementing CMOS delay buffer stages with sequentially decreasing gate widths to introduce the small amount of additional delay desired. This scheme avoids a transmission line design that calls for a large space, a more complicated design, and higher power consumption. With the electronic driver circuit disclosed herein, delay compensation is demonstrated as precise to within 3 ps across a designed 8 ps total delay under PVT corners. This is significantly better than the typical 100% error range that would otherwise be achieved with active delay. In addition, substantial delay time matching between individual segments in both optical and electrical domains is achieved. The techniques disclosed herein are directly applicable to high-speed optical communications at 25 Giga bits per second (GBPS) per channel and beyond.

Figure 1:
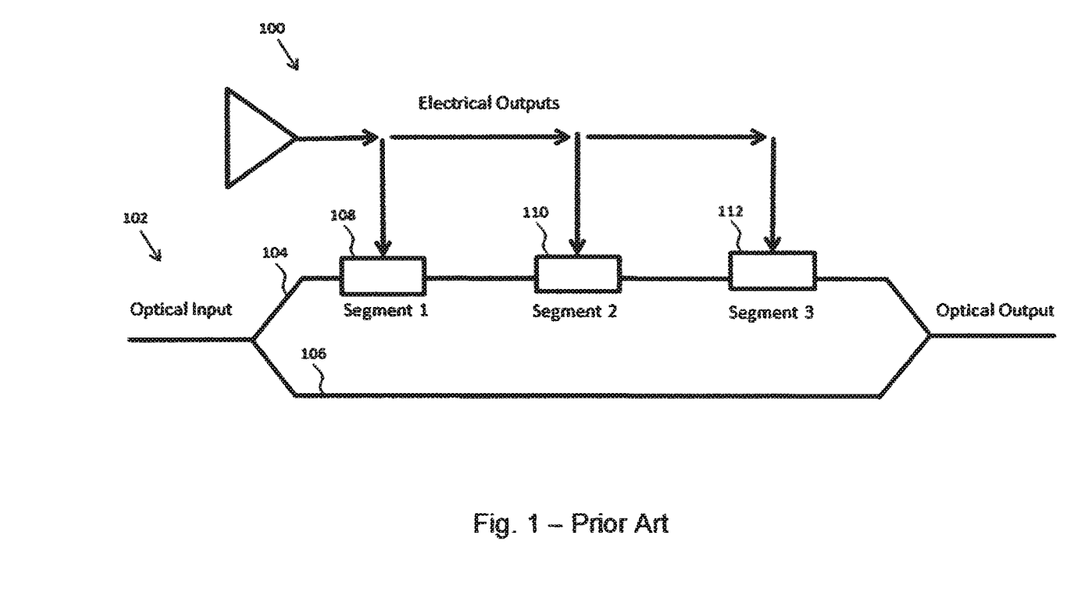
FIG. 1 is a schematic diagram of a segmented MZM coupled to a conventional electronic driver circuit.

FIG. 1 depicts a conventional electronic driver circuit 100 coupled to a segmented MZM 102. The MZM 102 is configured to split an optical input (e.g., an optical signal) into a first portion and a second portion. The first portion of the optical input is routed to and propagates through a first arm 104 (e.g., waveguide) of the MZM 102 while the second portion of the optical input is routed to and propagates through a second arm 106 of the MZM 102. In FIG. 1, a phase change is applied to the first portion of the input signal propagating through the first arm 104. The amount of phase change is a function of the electrical input voltage provided at a first segment 108, a second segment 110, and a third segment 112 by the conventional electronic driver circuit 100 coupled to the MZM 102. While three segments are illustrated, the first arm 104 may include any number of segments. Due to the phase change applied to the first portion of the input signal propagating through the first arm 104, when both portions of the input signal are later recombined, either constructive or destructive interference occurs at the optical output. Unfortunately, ensuring that the electrical signals from the conventional electronic driver circuit 100 are aligned with the optical signals of the MZM 102 is challenging.

Figure 2:
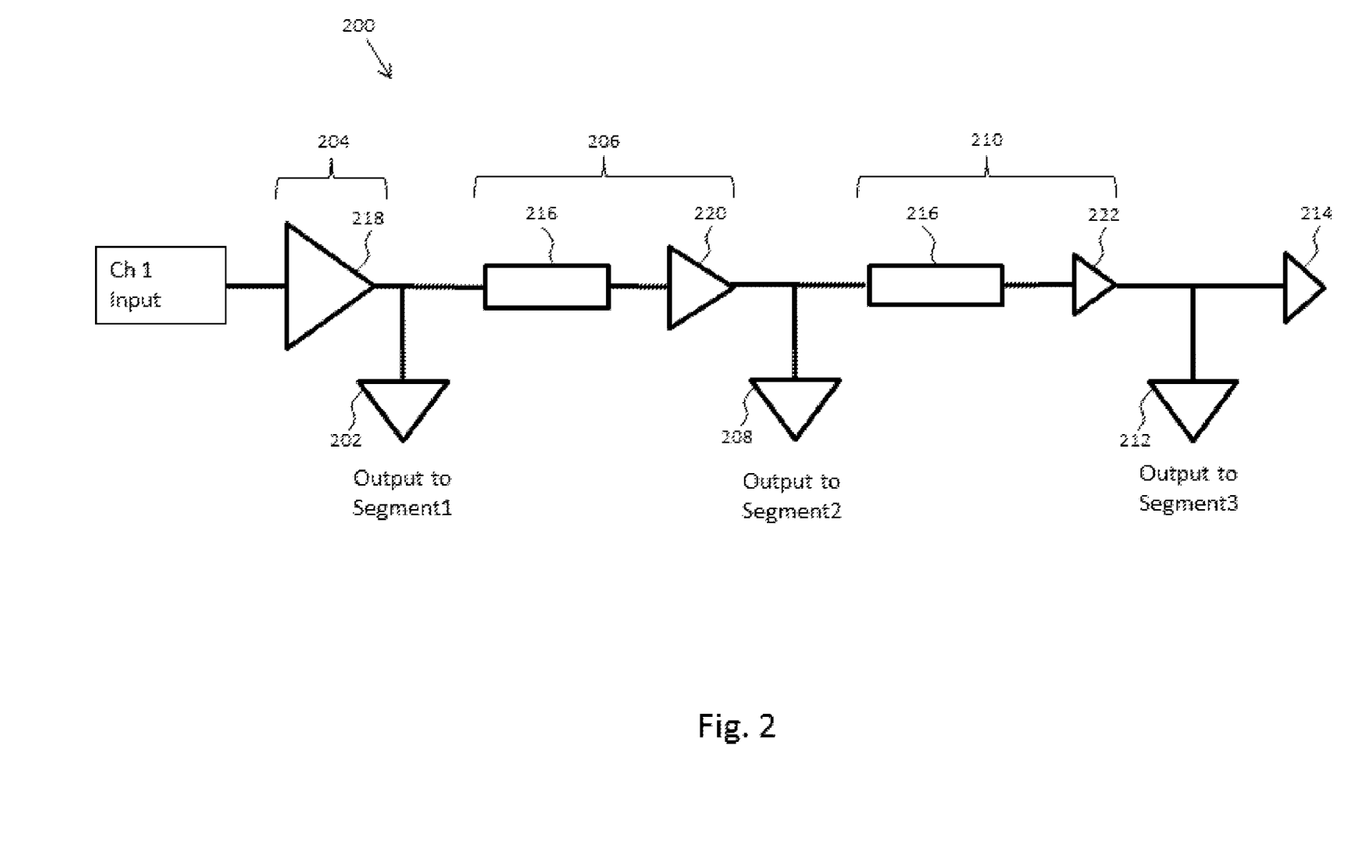
FIG. 2 is a schematic diagram of an embodiment electronic driver circuit configured to drive a segmented MZM.

FIG. 2 depicts an embodiment electronic driver circuit 200 configured to drive a segmented MZM such as, for example, the MZM 102 of FIG. 1. FIG. 2 represents a single-channel of a multi-channel (e.g., 4-channel) distributed electronic driver circuit where each channel operates similarly. In other words, the electronic driver circuit 200 may include any number of channels. In an embodiment, a driver circuit similar to driver circuit 200 may be operably coupled to each arm of an MZM in order to simultaneously change the phase of each arm.

In an embodiment, the electronic driver circuit 200 includes a first output buffer 202 (e.g., buffer amplifier) disposed between a first delay stage 204 and a second delay stage 206, a second output buffer 208 disposed between the second delay stage 206 and a third delay stage 210, and a third output buffer 212 following the third delay stage 210. The first delay stage 204 is configured to receive an input signal (e.g., an electrical signal) from a particular channel (e.g., channel 1). The first delay stage 204 is also configured to output an electrical signal to the first output buffer 202 and subsequently to a first segment (e.g., the first segment 108 in FIG. 1) and to the second delay stage 206. The second delay stage 206 receives an electrical signal from the first delay stage 204. The second delay stage 206 is configured to output an electrical signal to the second output buffer 208 and subsequently to a second segment (e.g., the second segment 110 in FIG. 1) and to the third delay stage 210. The third delay stage 210 receives an electrical signal from the second delay stage 206. The third delay stage 210 is configured to output an electrical signal to the third output buffer 212 and subsequently to a third delay stage (e.g., the third segment 112 in FIG. 1) and to the dummy load 214. In an embodiment, the dummy load 214 permits the design of delay stages (e.g., the second and third delay stages 206, 210) to be similar. While three delay stages 204, 206, 210 and three output buffers 202, 208, 212 are illustrated in FIG. 2, any number of delay stages and output buffers may be employed within the electronic driver circuit 200. As will be more fully explained below, each of the delay stages 204, 206, 210 in FIG. 2 is configured to add a delay to the electrical signal received by that stage.

In an embodiment, the second delay stage 206 and the third delay stage 210 in FIG. 2 each include a metal trace 216. The metal traces 216 are configured to provide a passive fixed delay. In an embodiment, the metal traces 216 have a length of about 650 micrometers (nm), which corresponds to about 4 ps of passive fixed delay. The metal traces 216 also serve to connect outputs of delay stages to inputs of delay stages together in series, but do not act as a transmission line. As known to those skilled in the art, transmission line effects can be neglected as long as the metal trace length is a small percentage of wavelength. Considering a frequency content up to about 25 Giga Hertz (GHz), a wavelength with effective dielectric constant of 4 is calculated to be about 6,000 µm. Generally, lengths less than $1/10^{th}$ of the wavelength may be treated as lumped, which in this example limits lengths to 600 µm. In an embodiment, the metal traces 216 are about 650 µm long. As such, transmission line effect may be safely neglected.

The first delay stage 204 includes a first delay buffer 218, the second delay stage 206 includes a second delay buffer 220, and the third delay stage 210 includes a third delay buffer 222. As will be more fully explained below, the delay buffers 218, 220, 222 are configured to provide an active delay. In an embodiment, each of the first, second, and third delay buffers 218, 220, 222 provides about 4 ps of active delay. In an embodiment, a total delay of 8 ps is desired from a delay stage (e.g., delay stage 204, 206), with 4 ps being fixed delay and coming from a passive metal trace (e.g., metal trace 216) and another 4 ps being active delay and coming from a delay buffer (e.g., delay buffer 218, 220, 222). In an embodiment, each of the first, second, and third delay buffers 218, 220, 222 and the first, second, and third output buffers 202, 208, 212 is implemented as a CMOS inverter.

Figure 3:
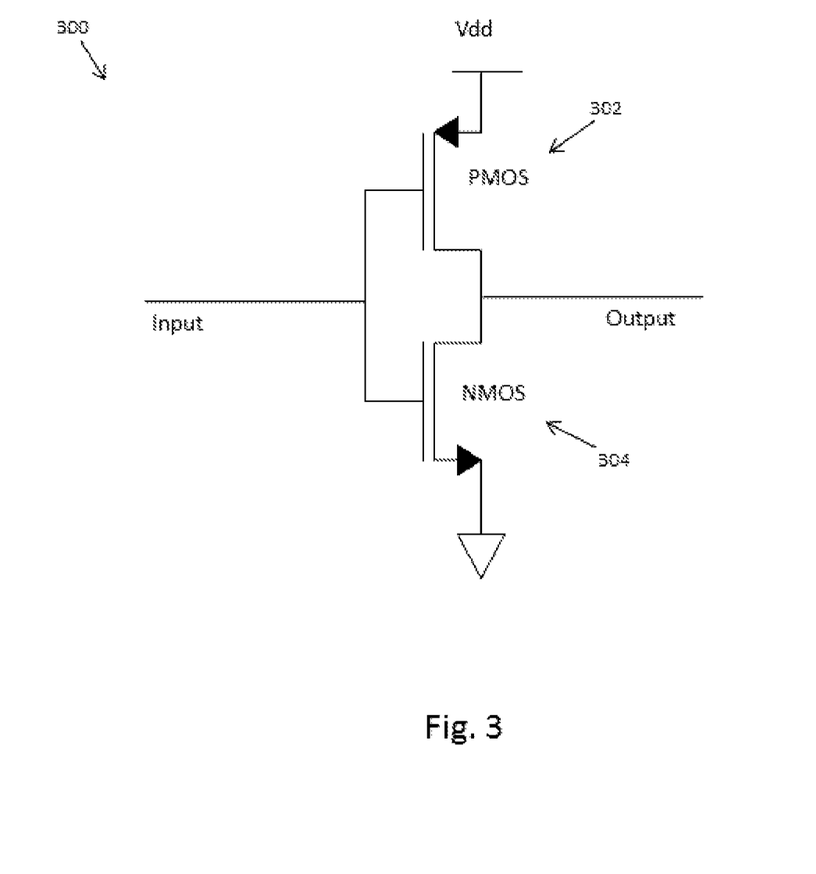
FIG. 3 is a schematic diagram of a CMOS inverter in the buffers of the embodiment electronic driver circuit.

FIG. 3 depicts a CMOS inverter 300 suitable for use as the delay buffers and the output buffers disclosed herein. The CMOS inverter 300 includes a PMOS transistor 302 and NMOS transistor 304. In the CMOS inverter 300, the gates and drains of the NMOS transistor 304 and the PMOS transistor 302 are coupled together, the source of the PMOS transistor 302 is coupled to a voltage supply, and the source of the NMOS transistor 304 is coupled to ground. Each transistor type provides an input capacitance load at the gate. Although the PMOS transistor 302 and NMOS transistor 304 are inherently different, inverters are designed to give symmetric rise/fall times.

In an embodiment, the gate width of each CMOS inverter 300 used as an output buffer (e.g., output buffers 202, 208, 212) is the same. In other words, the gate width of the CMOS inverter 300 in the first output buffer 202 is equivalent to the gate width of the CMOS inverter 300 in the second output buffer 208. Likewise, the gate width of the CMOS inverter 300 in the second output buffer 208 is equivalent to the gate width of the CMOS inverter 300 in the third output buffer 212. In an embodiment, the gate width of each of the CMOS inverters 300 used as an output buffer is small (e.g., between about 5 microns and 10 microns).

In an embodiment, the gate width of each CMOS inverter 300 used as a delay buffer (e.g., delay buffers 218, 220, 222) gets smaller with each successive delay stage. In other words, the gate width of the CMOS inverter 300 in the third delay buffer 222 is smaller than the gate width of the CMOS inverter 300 in the second delay buffer 220. Likewise, the gate width of the CMOS inverter 300 in the second delay buffer 220 is smaller than the gate width of the CMOS inverter 300 in the first delay buffer 218. This concept is represented by the sizes of the triangles used in FIG. 2 to represent the first, second, and third delay buffers 218, 220, 222. The sequentially-decreasing gate width configuration takes advantage of the fact that the input capacitance of a delay buffer is proportional, and the output resistance is inversely proportional, to the gate width. As will be more fully explained below, the use of ever smaller gate widths of the delay buffers in the successive delay stages 204, 206, 210 also takes advantage of the fact that delay on the $n^{th}$ output is approximately proportional to the product of the resistance (R) and the capacitance (C) in addition to the product of the output resistance on the $n^{th}$ delay buffer and the input capacitance of the $(n+1)^{th}$ delay buffer.

Figure 4:
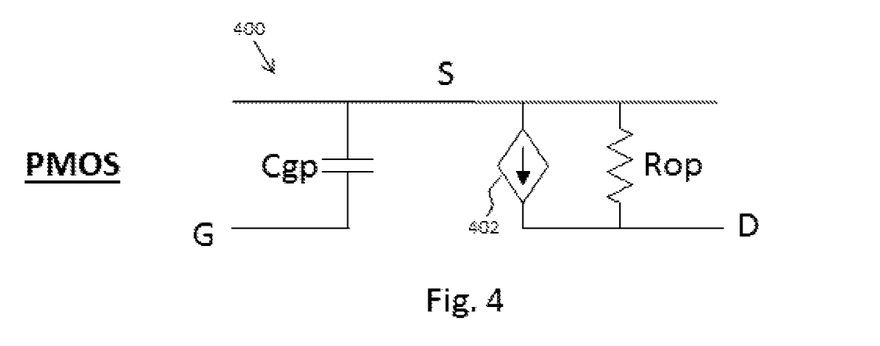
FIG. 4 is a circuit model of a p-channel metal-oxide-semiconductor (PMOS) within the CMOS inserter.
Figure 5:
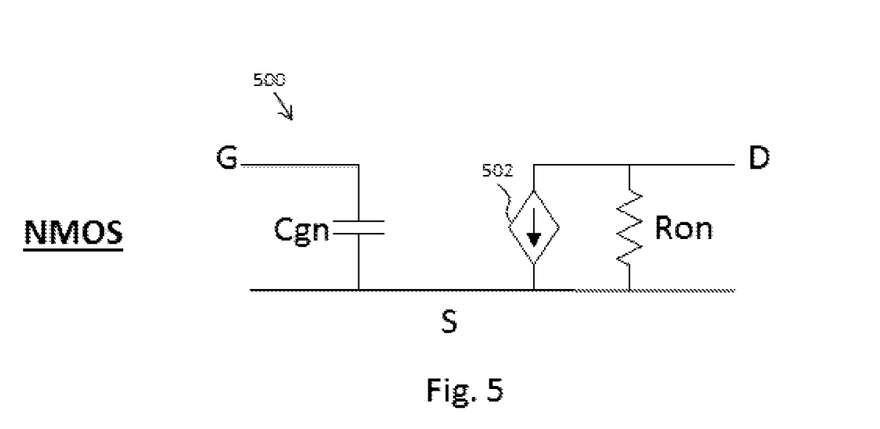
FIG. 5 is a circuit model of an n-channel metal-oxide-semiconductor (NMOS) within the CMOS inserter.

To aid in the understanding of why sequentially decreasing gate sizes provide a small delay time, equivalent circuit transistor models may be helpful. In that regard, the small-signal circuit model 400 for the PMOS transistor 302 and the small-signal circuit model 500 for the NMOS transistor 304 are provided in FIGS. 4 and 5, respectively. Each of the models 400, 500 contains a gate (G), a source (S), and a drain (D). The models 400, 500 are similar in that they both include a gate capacitance (e.g., Cgp, Cgn) and channel resistance (e.g., Rop, Ron). The models 400, 500 also each include a transconductance element 402, 502, respectively, that outputs current as a function of the voltage between gate and source. Input capacitance increases proportionally with gate width, and output channel resistance is inversely proportional to gate width.

Figure 6:
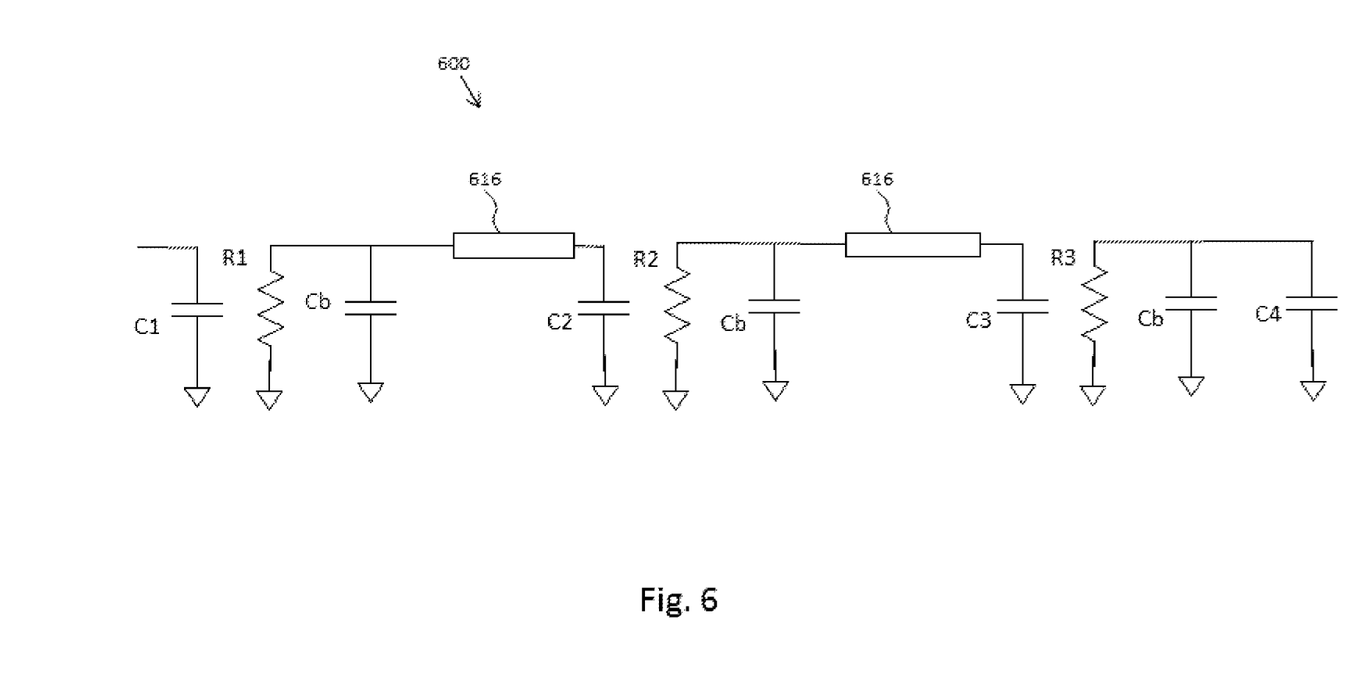
FIG. 6 is a functional circuit model of the embodiment electronic driver circuit of FIG. 2.

With CMOS topologies, only one transistor is intended to be on at any given time, and practically, this is a good assumption as only one transistor is on about 95% of the time. Further, the transconductance element 402, 502 for each transistor can be dropped from a delay circuit model. Therefore, as a first-order model for the block-diagram in FIG. 2, the models shown in FIGS. 4 and 5 can be generalized to the delay circuit model 600 shown in FIG. 6. As shown, $C_n$ and $R_n$ (where n is an integer 1, 2, 3 . . . ) are the effective input capacitance and output resistance of the $n^{th}$ delay buffer stage, respectively. $C_b$ is the input capacitance presented by the output buffer. The value of $C_b$ is independent of $R_n/C_n$ and is instead controlled by the gate width of the output buffer stages and is intentionally designed with a small gate width to limit its effect on delay. The delay circuit model 600 also includes metal traces 616 (or other fixed passive delay elements) similar to the metal traces 216 in FIG. 2.

Figure 7A:
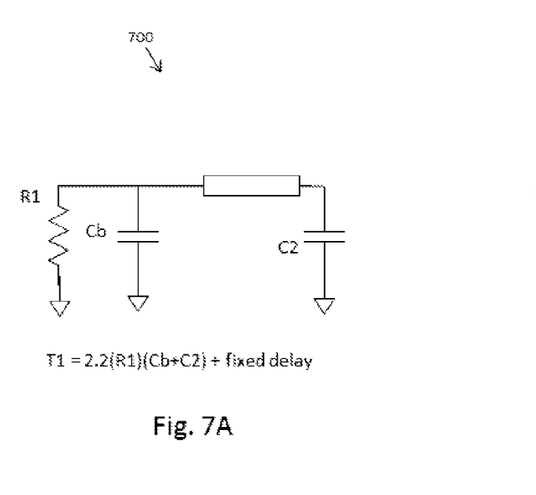
FIG. 7A is a first portion of the functional circuit model of FIG. 6 illustrating a first time delay between the first and second outputs of the embodiment electronic driver circuit of FIG. 2.
Figure 7B:
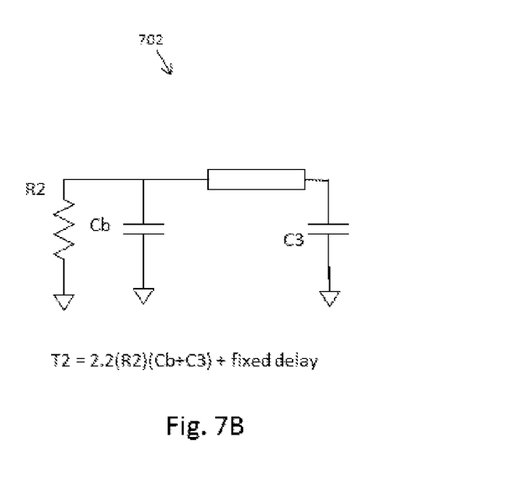
FIG. 7B is a second portion of the functional circuit model of FIG. 6 illustrating a second time delay between the second and third outputs of the embodiment electronic driver circuit of FIG. 2.

The active delay may be approximated as RC delay where R is the equivalent channel resistance, and C is comprised of the gate capacitances of the output buffer that follows immediately. The relevant circuit model portions 700, 702 from the circuit model 600 that are needed to calculate the delay are illustrated in FIGS. 7A and 7B, respectively. As shown in FIG. 7A, the active delay between first and second outputs (e.g., between input of the first output buffer 202 and the input of the second output buffer 208 in FIG. 2) is not related to the product of $R_1$ and $C_1$ (FIG. 6), but rather it is related to the product of $R_1$ and $C_2$. In order to minimize the active delay time, the R and C components need to be simultaneously reduced. $R_1$ is made smaller by using a wider gate width in an early delay stage. Similarly, $C_2$ is made smaller by having a narrower gate width in a later delay stage. In this manner, each sequential delay stage has a decreasing width to length (W/L) ratio, which leads to a reduced RC time-constant. This means that by using CMOS gates with successively decreasing size for each stage, a much smaller active delay is achieved relative to other known methods of generating active delay.

It can be observed that delay using the disclosed topology comprises an active delay contribution (e.g., provided by delay buffers) plus a passive fixed delay (e.g., provided by metal traces). For RC time constant, a factor of 2.2 is used to calculate 10% to 90% rise/fall delay time. Hence, total time delay between stages may be calculated as shown in FIGS. 7A and 7B. For example, total time delay may be approximated as $T_1=2.2$ $(R_1)(C_b+C_2)$+fixed delay, and $T_2=2.2$ $(R_2)(C_b+C_3)$+fixed delay.

Using the design disclosed herein, the total delay may be controlled as a function of the scaling factor between stages (e.g., delay stages 204, 206, 210 in FIG. 2). For example, using delay buffers (e.g., delay buffers 218, 220, 222 in FIG. 2) having gate widths of 4 w, 2 w, and w, respectively, where w is some unit gate width for PMOS/NMOS devices. In this case, the gate width of the delay buffer in each of the successive delay stages is reduced by a factor of 2. If a smaller active delay is desired, delay buffer dimensions may be changed to 16 w, 4 w, w, respectively, such that the gate width of the delay buffer in each successive stage is reduced by a factor of 4. With such a change, output resistance is reduced to ¼ while input capacitance doubles to cause the net effect of delay to scale by half Those skilled in the art will recognize that due to output buffer load $C_b$, metal trace parasitic elements, and/or additional parasitic elements not in the model, time delay may not be reduced by exactly half. Similarly, due to the additional loading, time delay between the first and second output buffers may be slightly different from delay between second and third output buffers. Gate widths may be tuned accordingly. In an embodiment, the gate widths of the delay buffers range between about 120 microns (the largest gate width of the first stage) and 30 microns (the smallest gate width for the last stage).

As power consumption is proportional to $fCV^2$, where f is frequency, C is capacitance, and V is voltage, increasing first stage gate width causes increasingly more power consumption. This is further aggravated by the possibility that additional pre-buffer stages may be required to drive such a large first stage. This indicates that from a power consumption perspective, it may be preferable to err on having slightly more delay rather than less.

Only active delay is sensitive to PVT corners, while passive delay is relatively insensitive to PVT. The concepts disclosed herein exploit the fixed delay insensitivity such that each delay segment is designed to maximize fixed delay and minimize active delay time. A smaller time-constant from the active devices allows less variation over PVT, which means more precise delay. Minimum gate lengths are used to maintain the fastest possible switching speed.

Figure 8:
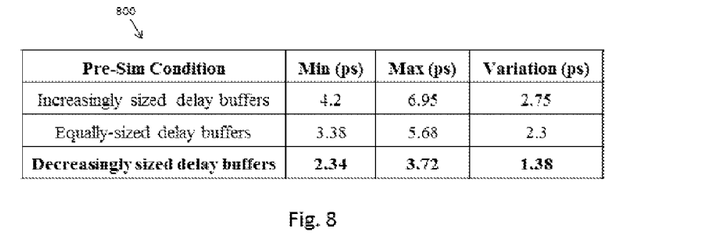
FIG. 8 is table comparing delay due to PVT variation across different transistor sizing conditions under pre-simulated models and excluding fixed delay.

For comparison, pre-layout simulated models that do not include the fixed delay section are provided in table 800 of FIG. 8. In order to maintain high yield, analysis is performed across all PVT corner cases. Variations in the physical process that affect gate dimensions, mobility, or other transistor features may result in slower or faster transistor action. Higher supply voltage similarly allows faster switching by allowing higher current. Lower temperature increases mobility that also allows faster switching. In the simulation results presented in FIG. 8, process is varied across Slow-Slow (SS), Typical-Typical (TT), and Fast-Fast (FF); supply voltage is varied from 0.95V, 1V, to 1.05V; and temperature is varied from −40° C., +50° C., to +120° C.

In FIG. 8, the last row represents the actual design for the delay between the outputs of delay buffers (e.g., between the input of first output buffer 202 and the input of the second output buffer 208 in FIG. 2). As expected, this scenario provides smallest delay and smallest delay variation on an absolute time (e.g., picosecond (ps)) basis. In the increasingly sized case, transistor sizes for the first and third delay stages (e.g., the first delay stage 204 and the third delay stage 210 in FIG. 2) are swapped. It can be clearly seen that increasingly sized delay buffers shows larger total delay as well as larger absolute variation in delay as compared to the decreasingly sized delay buffers. The scenario with the equally-sized delay buffers assumes that the sizing of the second delay stage (e.g., the second delay stage 206) is also used for both the first and third delay stages. For the equally-sized delay buffers, actual size is not a major factor, as changing gate width will simultaneously change R and C in opposite directions.

Figure 9:
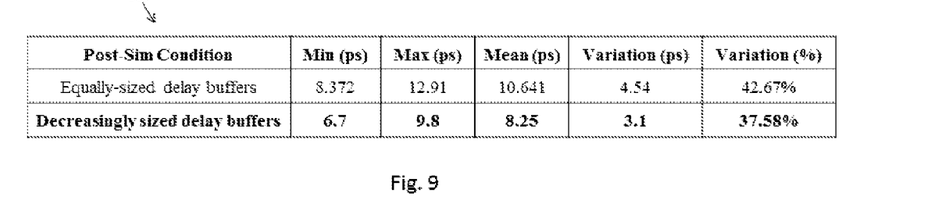
FIG. 9 is table comparing delay due to PVT variation across different transistor sizing conditions under post-simulated models.

Post-layout simulated models including layout parasitic effects and fixed delay are presented in table 900 of FIG. 9. This simulation represents all known effects in the model and may take several days to run to completion. Results show decreasingly sized delay buffers show variation to be within 3.1 ps or 37.58% against the mean across all corners. Comparison with equally-sized delay buffer stages with the second delay stage sizing from the actual design applied to both the first and third stages is also provided. Consistent with pre-layout simulation trends, the equally sized delay buffer stage design shows larger variation on both an absolute and percent basis than the decreasingly sized delay buffer stage design and has high nominal delay above 10 ps with over 4.5 ps of variation.

Figure 10:
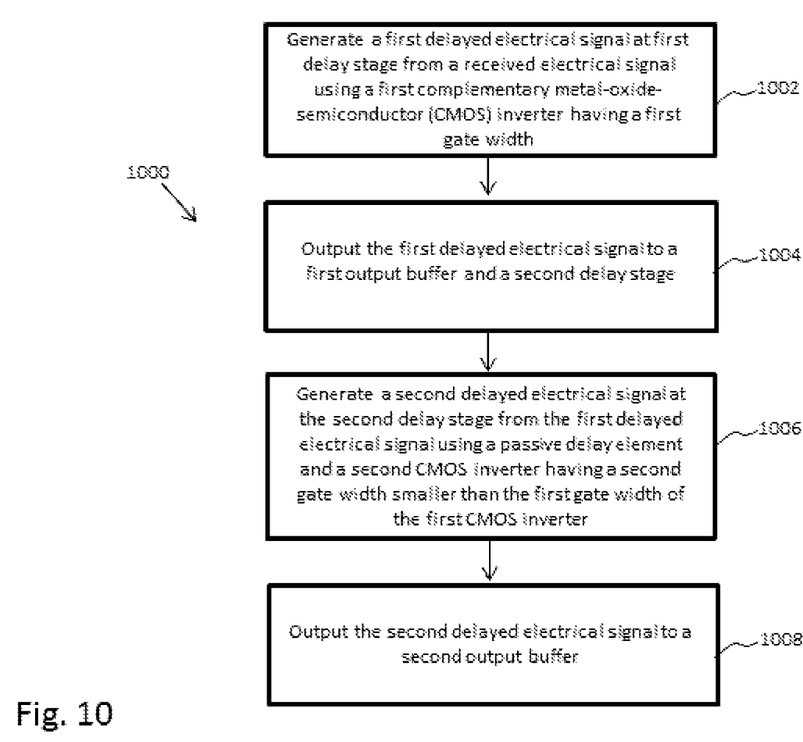
FIG. 10 is a flowchart of an embodiment method of driving a segmented MZM.

FIG. 10 depicts a method 1000 of driving a modulator such as a segmented MZM. The method 1000 may be implemented when there is a desire to delay electrical signals so that they are aligned with the optical signals propagating through the segmented MZM. In block 1002, a first delayed electrical signal is generated at first delay stage from a received electrical signal using a first CMOS inverter having a first gate width. In block 1004, the first delayed electrical signal is output to a first output buffer and a second delay stage. In block 1006, a second delayed electrical signal is generated at the second delay stage from the first delayed electrical signal using a passive delay element and a second CMOS inverter. The second CMOS inverter has a second gate width smaller than the first gate width of the first CMOS inverter. In block 1008, the second delayed electrical signal is output to a second output buffer.

From the foregoing, those skilled in the art will appreciate that a new circuit for delay compensation in a distributed MZM driver employing decreasingly sized delay buffer stages is disclosed. The circuit has the advantage of being compact, providing accurate delay, and remaining precise over PVT corners to allow high yield. Moreover, the circuit is simple to design once the technique is understood.

While several embodiments have been provided in the present disclosure, it should be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and could be made without departing from the spirit and scope disclosed herein.

What is claimed is:

1. An electronic driver circuit for a segmented modulator, comprising:

a first delay stage comprising a first delay buffer and a first output buffer coupled to the first delay buffer, with the first delay buffer receiving an electrical signal input at a first delay stage input and outputting a first delayed electrical signal at a first delay stage output and to the first output buffer, with the first output buffer coupled to a first segment of the segmented modulator and with the first delay buffer comprising a first complementary metal-oxide-semiconductor (CMOS) inverter having a first gate width; and a second delay stage including a second delay stage input coupled to and receiving the first delayed electrical signal from the first delay stage output, the second delay stage comprising a first metal trace coupled to a second delay buffer and a second output buffer coupled to the second delay buffer, with the second delay buffer outputting a second delayed electrical signal at a second delay stage output and to the second output buffer, wherein the second delayed electrical signal is generated from the first delayed electrical signal, with the second output buffer coupled to a second segment of the segmented modulator and with the second delay buffer comprising a second CMOS inverter having a second gate width that is smaller than the first gate width of the first CMOS inverter.

2. The electronic driver circuit of claim 1, further comprising a third delay stage including a third delay stage input coupled to and receiving the second delayed electrical signal from the second delay stage output, the third delay stage comprising a second metal trace coupled to a third delay buffer, the third delay buffer outputting a third delayed electrical signal at a third delay stage output and to a third output buffer, wherein the third delayed electrical signal is generated from the second delayed electrical signal and wherein the third output buffer is coupled to a third segment of the segmented modulator, with the third output buffer comprising a third CMOS inverter having a third gate width that is smaller than the second gate width of the second CMOS inverter.

3. The electronic driver circuit of claim 2, wherein the first output buffer comprises a fourth CMOS inverter having a fourth gate width, wherein the second output buffer comprises a fifth CMOS inverter having a fifth gate width, and wherein the third output buffer comprises a sixth CMOS inverter having a sixth gate width.

4. The electronic driver circuit of claim 3, wherein the gate widths of the fourth CMOS inverter, the fifth CMOS inverter, and the sixth CMOS inverter are about the same and are independent of the gate widths of the first CMOS inverter, the second CMOS inverter, and the third CMOS inverter.

5. The electronic driver circuit of claim 2, wherein the first gate width is about twice as wide as the second gate width and wherein the third gate width is about half as wide as the second gate width.

6. The electronic driver circuit of claim 2, wherein the first gate width is about four times as wide as the second gate width and wherein the third gate width is about a quarter as wide as the second gate width.

7. The electronic driver circuit of claim 2, wherein the first delayed electrical signal has been delayed by an active delay produced by the first delay buffer, wherein the second delayed electrical signal has been delayed by an active delay produced by the second delay buffer plus a passive delay produced by the first metal trace, and wherein the third delayed electrical signal has been delayed by an active delay produced by the third delay buffer plus a passive delay produced by the second metal trace.

8. The electronic driver circuit of claim 2, wherein the delay in the third delayed electrical signal with respect to the received electrical signal comprises an active delay produced by the first delay buffer, an active delay produced by the second delay buffer, an active delay produced by the third delay buffer, a passive delay produced by the first metal trace, and a passive delay produced by the second metal trace.

9. The electronic driver circuit of claim 1, wherein the first delayed electrical signal has been delayed by an active delay produced by the first delay buffer, and wherein the second delayed electrical signal has been delayed by an active delay produced by the second delay buffer and a passive delay produced by the first metal trace.

10. The electronic driver circuit of claim 9, wherein the active delay produced by the first delay buffer is about 4 picoseconds (ps), wherein the active delay produced by the second delay buffer is about 4 ps, and wherein the passive delay produced by the first metal trace is about 4 ps.

11. An electronic driver circuit for a segmented modulator, comprising:
a first delay stage comprising a first active delay element having a first gate width, the first active delay element introducing a first active delay to a received electrical signal to produce a first delayed signal, the first delay stage being coupled to a first output buffer for driving a first segment of the segmented modulator; and
a second delay stage operably coupled to the first delay stage, the second delay stage comprising a first passive delay element and a second active delay element, the second active delay element having a second gate width smaller than the first gate width of the first active delay element, the first passive delay element introducing a first passive delay and the second active delay element introducing a second active delay to the first delayed signal to produce a second delayed signal, the second delay stage being coupled to a second output buffer for driving a second segment of the segmented modulator.

12. The electronic driver circuit of claim 11, wherein a third delay stage is operably coupled to the second delay stage, the third delay stage comprising a second passive delay element and a third active delay element, the third active delay element having a third gate width smaller than the second gate width, the second passive delay element introducing a second passive delay and the third active delay element introducing a third active delay to the second delayed signal to produce a third delayed signal, the third delayed signal being coupled to a third output buffer for driving a third segment of the segmented modulator.

13. The electronic driver circuit of claim 12, wherein each of the first active delay element, the second active delay element, and the third active delay element is a complementary metal-oxide-semiconductor (CMOS) inverter disposed in a delay buffer.

14. The electronic driver circuit of claim 12, wherein each of the first output buffer, the second output buffer, and the third output buffer is a complementary metal-oxide-semiconductor (CMOS) inverter.

15. The electronic driver circuit of claim 11, wherein the first passive delay element is a metal trace.

16. The electronic driver circuit of claim 15, wherein a length of the metal trace is less than one-tenth of a wavelength of the received electrical signal.

17. A method of driving a circuit, comprising:
generating, at a first delay stage, a first delayed electrical signal from a received electrical signal using a first complementary metal-oxide-semiconductor (CMOS) inverter having a first gate width;
outputting the first delayed electrical signal to a first output buffer and a second delay stage;
driving, by the first output buffer, a first segment of a segmented modulator;
generating, at the second delay stage, a second delayed electrical signal from the first delayed electrical signal using a first passive delay element and a second CMOS inverter, the second CMOS inverter having a second gate width smaller than the first gate width of the first CMOS inverter;

outputting the second delayed electrical signal to a second output buffer; and driving, by the second output buffer, a second segment of the segmented modulator.

18. The method of claim 17, further comprising:

outputting the second delayed electrical signal to a third delay stage;

generating, at the third delay stage, a third delayed electrical signal from the second delayed electrical signal using a second passive delay element and a third CMOS inverter, the third CMOS inverter having a third gate width smaller than the second gate width of the second CMOS inverter;

outputting the third electrical signal to a third output buffer; and driving, by the third output buffer, a third segment of the segmented modulator.

19. The method of claim 18, wherein the first output buffer, the second output buffer, and the third output buffer each comprise an output CMOS inverter, and wherein the first passive delay element and the second passive delay element each comprises a metal trace.

* * * * *

UNITED STATES PATENT AND TRADEMARK OFFICE
CERTIFICATE OF CORRECTION

| | | |
|---|---|---|
| PATENT NO. | : 9,964,832 B2 | Page 1 of 1 |
| APPLICATION NO. | : 14/723839 | |
| DATED | : May 8, 2018 | |
| INVENTOR(S) | : Morgan Chen et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 0 days.

Signed and Sealed this
Twenty-sixth Day of June, 2018

Andrei Iancu
*Director of the United States Patent and Trademark Office*